US006928591B2

(12) United States Patent
Grinchuk et al.

(10) Patent No.: US 6,928,591 B2
(45) Date of Patent: Aug. 9, 2005

(54) FAULT REPAIR CONTROLLER FOR REDUNDANT MEMORY INTEGRATED CIRCUITS

(75) Inventors: Mikhail I. Grinchuk, San Jose, CA (US); Ranko Scepanovic, San Jose, CA (US); Ghasi R. Agrawal, Sunnyvale, CA (US)

(73) Assignee: LSI Logic Corporation, Milpitas, CA (US)

( * ) Notice: Subject to any disclaimer, the term of this patent is extended or adjusted under 35 U.S.C. 154(b) by 399 days.

(21) Appl. No.: 10/328,700

(22) Filed: Dec. 23, 2002

(65) Prior Publication Data

US 2004/0128593 A1 Jul. 1, 2004

(51) Int. Cl.[7] .................................................. G11C 29/00
(52) U.S. Cl. ...................................... 714/710; 714/723
(58) Field of Search ................................ 714/710, 711, 714/718, 723, 722, 48, 54, 42, 7, 8; 365/200, 201, 231, 230.01; 711/200, 202, 206

(56) References Cited

U.S. PATENT DOCUMENTS 4,751,656 A * 6/1988 Conti et al. .................... 716/1

6,026,505 A * 2/2000 Hedberg et al. ............. 714/711
6,795,942 B1 * 9/2004 Schwarz ..................... 714/718
2003/0101389 A1 * 5/2003 Rieger ........................ 714/710

OTHER PUBLICATIONS

John R. Day, "A Fault–Driven, Comprehensive Redundancy Algorithm", International Test Conference 1984, Jun. 1985, pps. 35–44.

Wei Kang Huang et al., "New Approaches for the Repairs of Memories with Redundancy by Row/Column Deletion for Yield Enhancement", IEEE Transactions On Computer–Aided Design, vol. 9, No. 3, Mar. 1990, pps. 323–328.

* cited by examiner

*Primary Examiner*—Christine T. Tu
(74) *Attorney, Agent, or Firm*—Fitch, Even, Tabin & Flannery

(57) ABSTRACT

A controller for repairing a redundant memory circuit includes a fault storage matrix for mapping a repair solution, a plurality of registers for storing row and column coordinates of the repair solution, and a repair solution calculator coupled to the plurality of registers and the fault storage matrix for receiving an x-coordinate and a y-coordinate of a defective memory cell in the redundant memory circuit and for determining whether a repair solution may be found from the fault storage matrix.

15 Claims, 7 Drawing Sheets

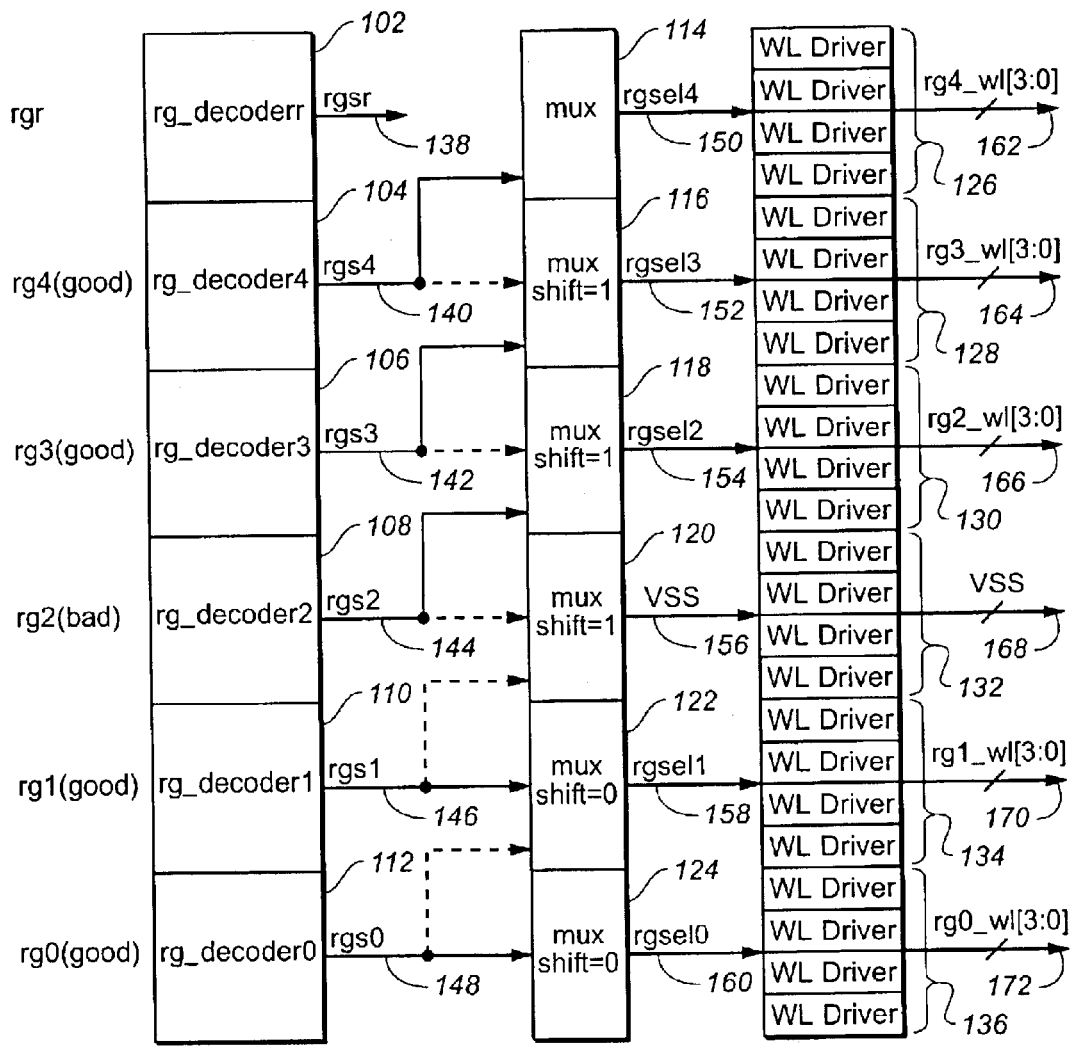
FIG._1

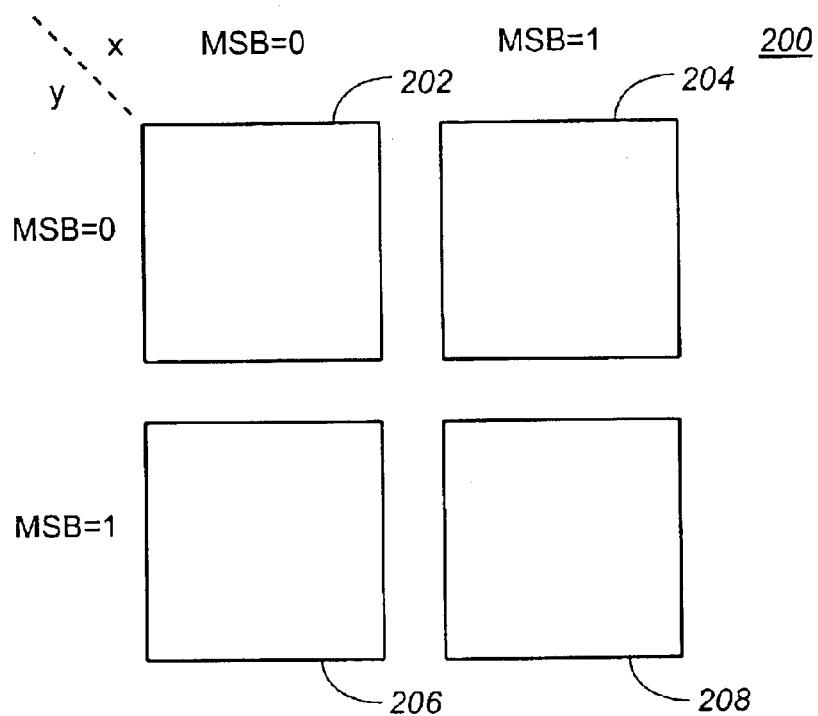
FIG._2
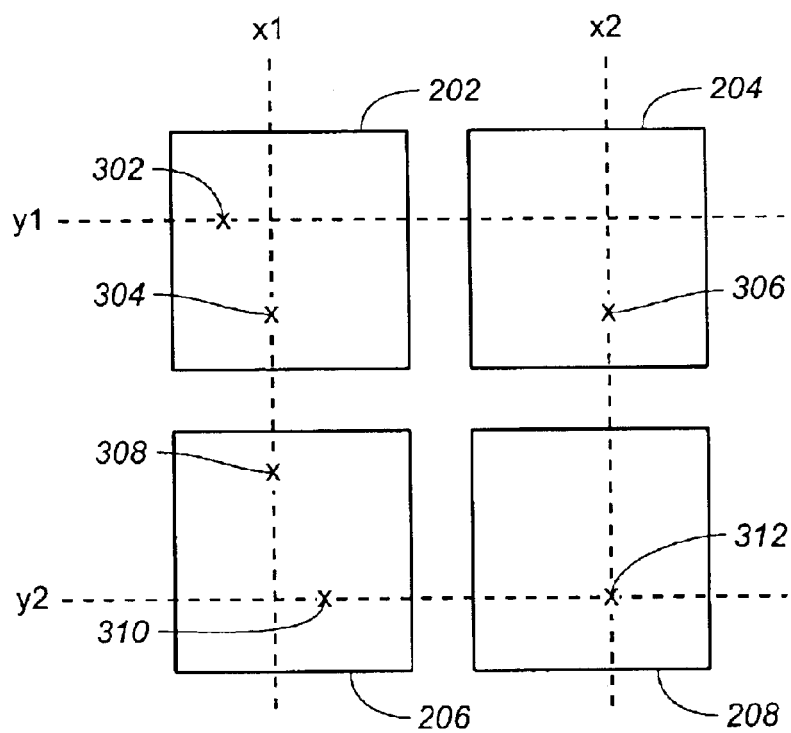
FIG._3

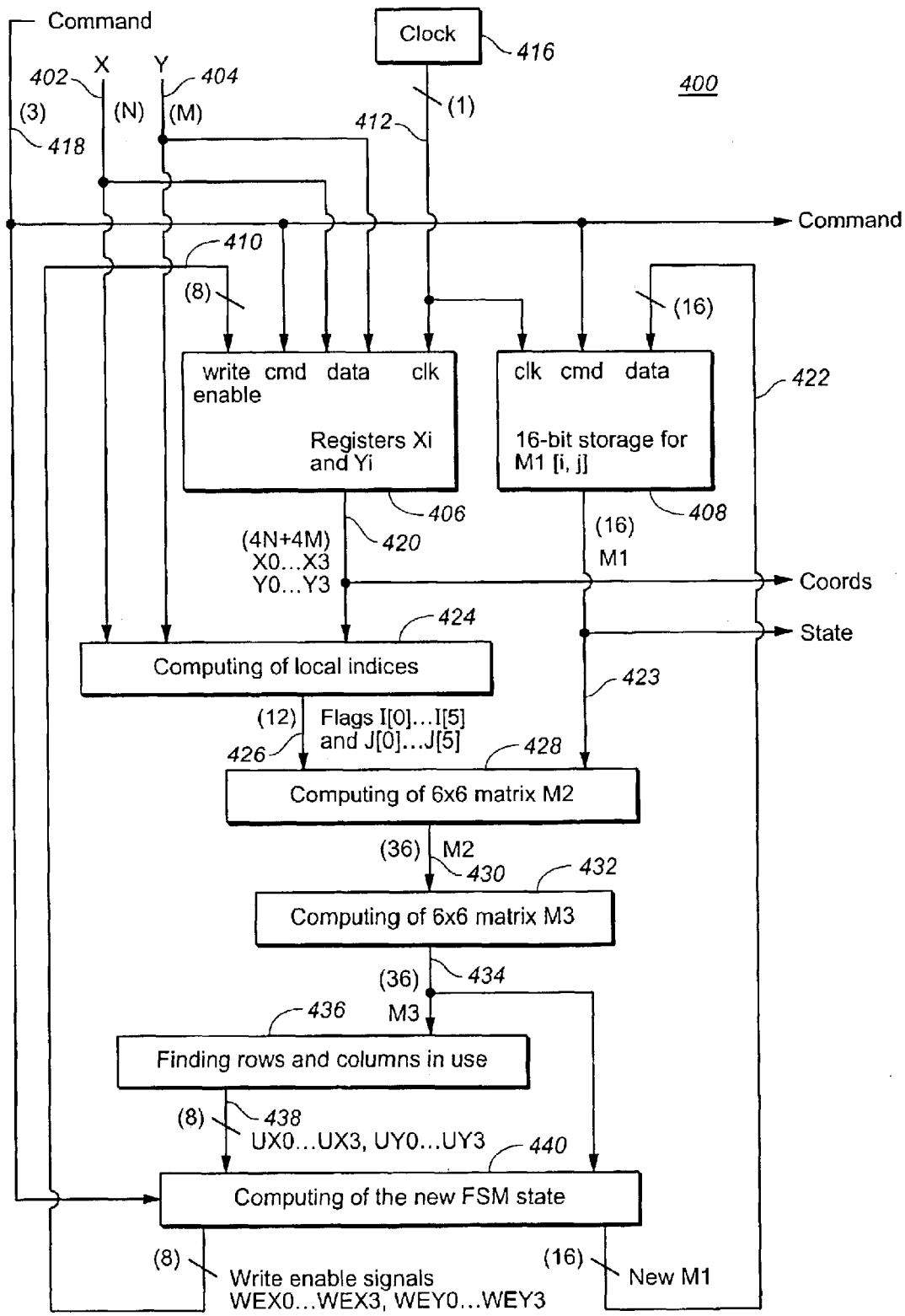
FIG._4

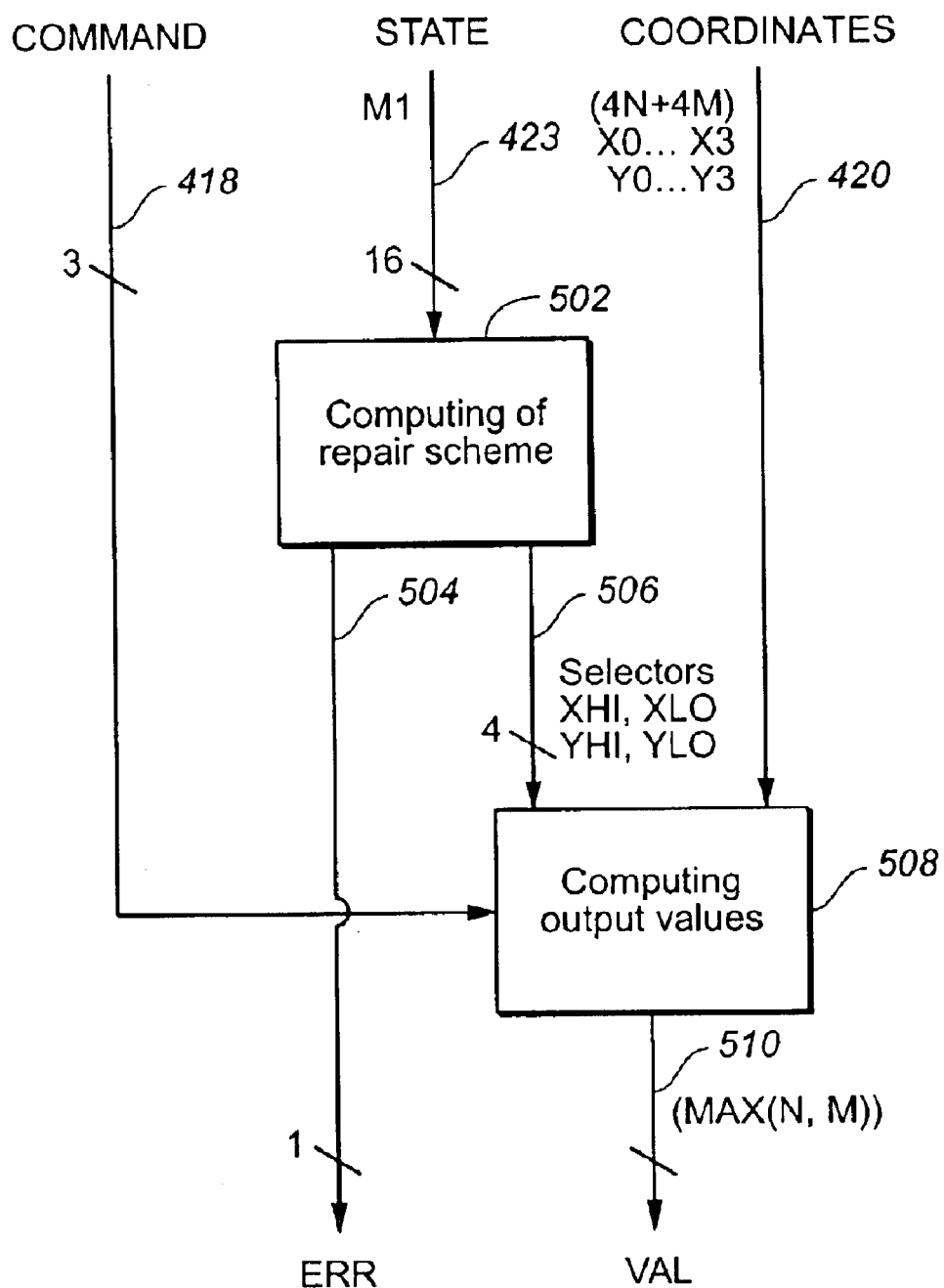
FIG._5

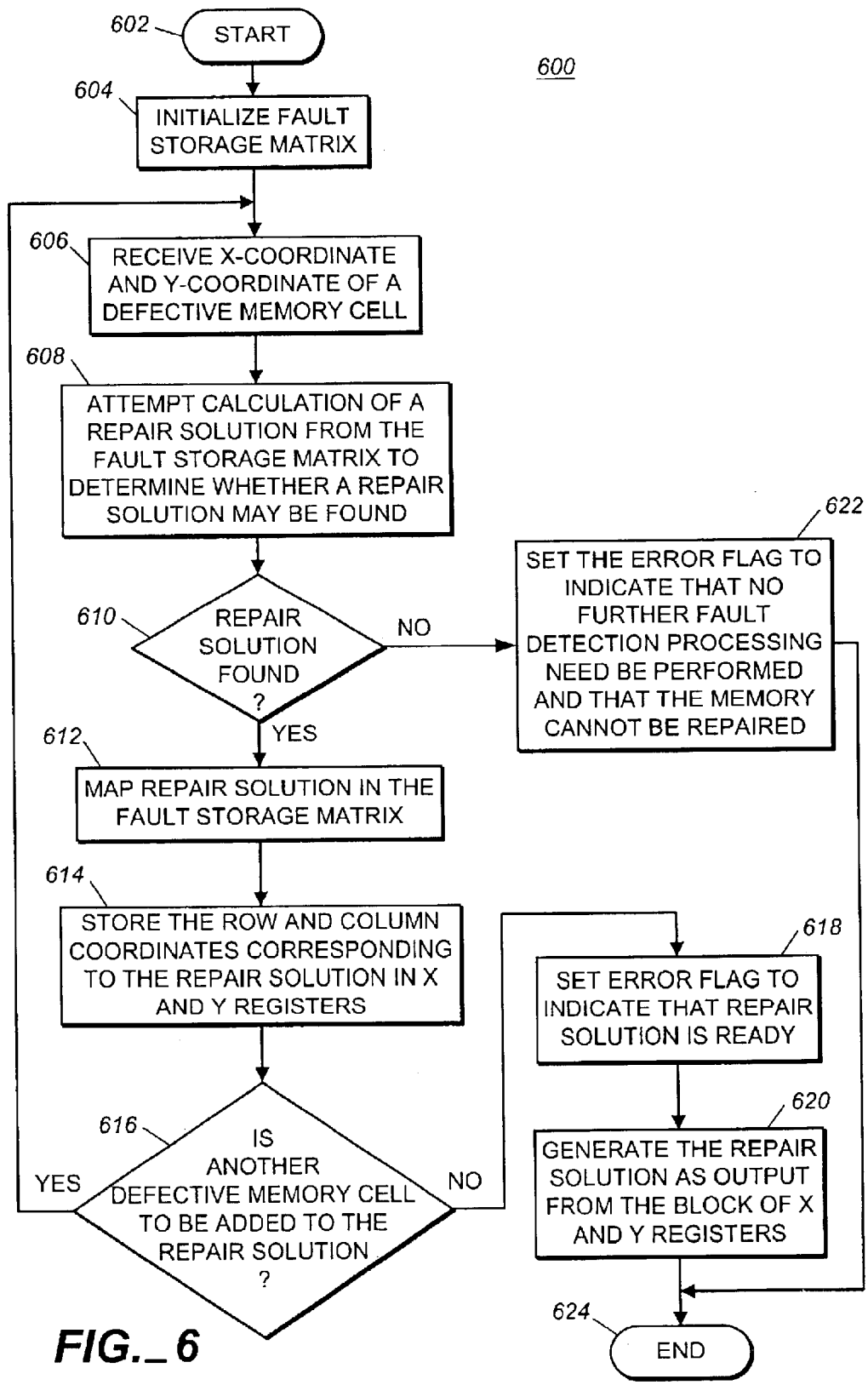
FIG._6

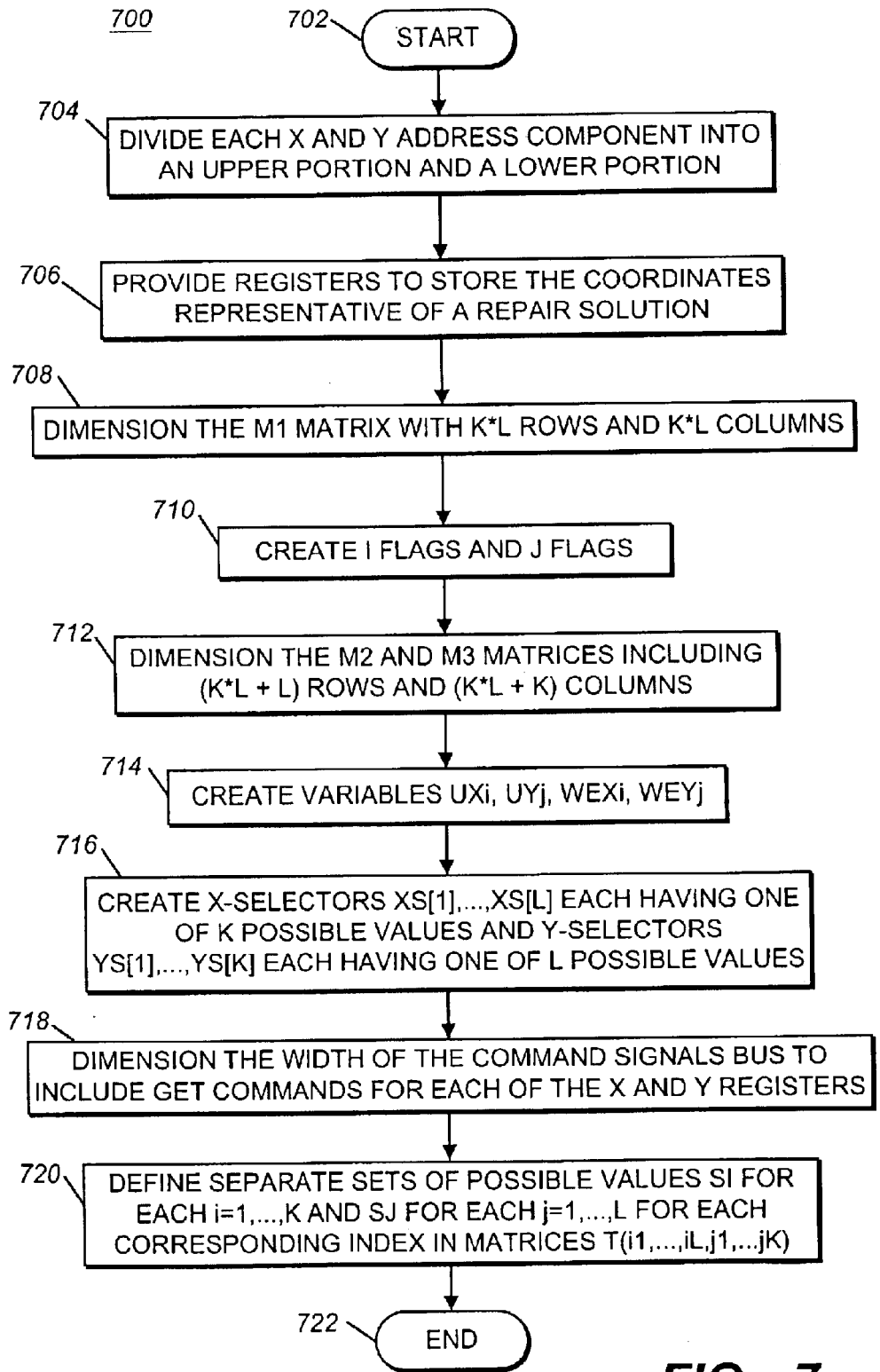
FIG._7

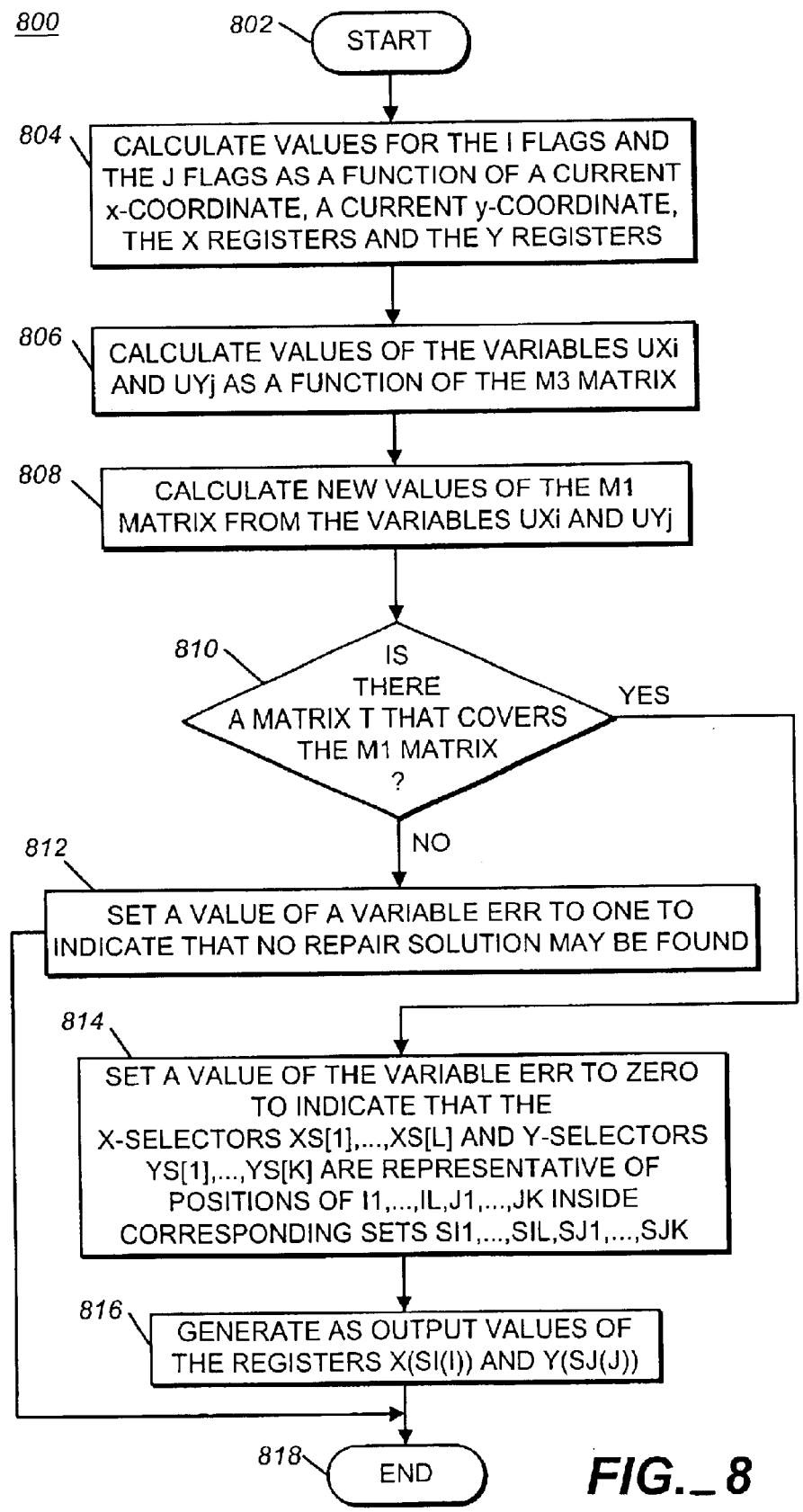
FIG._8

FAULT REPAIR CONTROLLER FOR REDUNDANT MEMORY INTEGRATED CIRCUITS

BACKGROUND OF THE INVENTION

1. Field of the Invention

The present invention is directed to the manufacture of integrated circuit memories. More specifically, but without limitation thereto, the present invention is directed to a method of repairing defective cells in a redundant memory.

2. Description of the Prior Art

Memory circuits are devices that store and recall representations of numeric values in a range of locations each referenced by a specific address. Data is typically stored in a write operation by placing an address on an address bus of the memory circuit, the data to be written on a data bus of the memory circuit and selecting a write operation on a read/write control line of the memory circuit. Data is typically recalled in a read operation by placing an address on an address bus of the memory circuit, selecting a read operation on the read/write control line, and reading the data from the data bus. As the density of memory chips increases, the probability of having defective memory circuits on a chip likewise increases. To improve the percentage of properly functioning memory circuits, or wafer yield, semiconductor manufacturers have used various redundancy techniques. Redundancy means that reserve cells are arranged in spare rows, columns, or blocks on the memory circuit chip. The reserve cells may be used to replace defective cells.

SUMMARY OF THE INVENTION

In one aspect of the present invention, a controller for repairing a redundant memory circuit includes a fault storage matrix for mapping a repair solution, a plurality of registers for storing row and column coordinates of the repair solution, and a repair solution calculator coupled to the plurality of registers and the fault storage matrix for receiving an x-coordinate and a y-coordinate of a defective memory cell in the redundant memory circuit and for determining whether a repair solution may be found from the fault storage matrix.

In another aspect of the present invention, a method of repairing faults in a redundant memory includes steps for:

(a) initializing a fault storage matrix;

(b) receiving an x-coordinate and a y-coordinate of a defective memory cell;

(c) attempting a calculation of a repair solution from the fault storage matrix and the x-coordinate and a y-coordinate of a defective memory cell to determine whether a repair solution may be found;

(d) if the repair solution may be found, then transferring control to step (e), else transferring control to step (j);

(e) mapping the repair solution in the fault storage matrix;

(f) storing row and column coordinates representative of the repair solution in a plurality of registers;

(g) if another defective memory cell is to be added to the repair solution, then transferring control to step (b), else transferring control to step (h);

(h) setting an error flag to indicate that the repair solution is ready;

(i) generating the repair solution from the plurality of registers as output and transferring control to step (k);

(j) setting the error flag to indicate that no further fault detection processing need be performed and that the memory cannot be repaired; and (k) terminating.

In a further aspect of the present invention, a method of creating a netlist for repairing faults in a memory partitioned into K horizontal segments and L vertical segments and one correction line includes steps for:

(a) dividing each x and y address component into an upper portion and a lower portion;

(b) providing K*L registers to store the coordinates representative of a repair solution including L groups of X registers having K registers in each group and K groups of Y registers having L registers in each group;

(c) dimensioning an M1 matrix with K*L rows and K*L columns;

(d) creating (K*L+L) I flags and (K*L+K) J flags;

(e) dimensioning M2 and M3 matrices with (K*L+L) rows and (K*L+K) columns to include one extra column for each of L vertical strips and one extra row for each of K horizontal strips;

(f) creating variables UXi, UYj, WEXi, WEYj wherein i=1, ... , L and j=1, ... , K;

(g) creating X-selectors XS[1], ... , XS[L] each having one of K possible values and Y-selectors YS[1], ... , YS[K] each having one of L possible values;

(h) dimensioning the width of the command signals bus to include GET commands for each of the X and Y registers; and (i) defining separate sets of possible values SI for each i=1, ... , K and SJ for each j=1, ... , L for each corresponding index in matrices T(i1, ... , iL, j1, ... jK).

DESCRIPTION OF THE DRAWINGS

The present invention is illustrated by way of example and not limitation in the accompanying figures, in which like references indicate similar elements throughout the several views of the drawings, and in which:

FIG. 1 illustrates a repair circuit for a redundant memory of the prior art;

FIG. 2 illustrates a partition of a memory array according to an embodiment of the present invention;

FIG. 3 illustrates the partition of the memory array in FIG. 2 for which a repair solution may be found;

FIG. 4 illustrates a pre-processing engine 400 of a fault repair controller for redundant memories according to an embodiment of the present invention; and FIG. 5 illustrates a post-processing engine according to an embodiment of the present invention;

FIG. 6 illustrates a flow chart for a method of repairing faults in a redundant memory according to an embodiment of the present invention;

FIG. 7 illustrates a flow chart for a method of creating a netlist for a memory partitioned into K row segments and L column segments and one correction line according to an embodiment of the present invention; and FIG. 8 illustrates a flow chart for a method of calculating a repair solution for the netlist of FIG. 7.

To simplify referencing in the description of the illustrated embodiments of the present invention, indicia in the figures may be used interchangeably to identify both the signals that are communicated between the elements and the connections that carry the signals. For example, an address communicated on an address bus may be referenced by the same number used to identify the address bus.

Elements in the figures are illustrated for simplicity and clarity and have not necessarily been drawn to scale. For example, the dimensions of some of the elements in the figures may be exaggerated relative to other elements to help to improve understanding of the following description of the illustrated embodiments.

DESCRIPTION OF THE ILLUSTRATED EMBODIMENTS

In a redundant memory, spare elements and a fault repair control circuit inside the memory circuit are typically used to effect the repair of defective memory cells. The defective memory cells must first be detected and identified by a memory fault detection algorithm. Preferably, a fault detection algorithm should be able to detect whether a fault may be repaired and should also be able to determine an optimum repair solution quickly. Also, the fault algorithm should be implemented with minimum area overhead, that is, a minimum number of logic gates. If a large area is required to implement the repair algorithm, the savings realizable from the addition of the repair circuitry would be disadvantageously offset.

A repair algorithm cooperates with a self-test engine that detects and identifies the defects inside the memory. The self-test engine is widely available in currently available memory circuits and is commonly referred to as the Built-In Self-Test (BIST). Typically, the Built-In Self-Test makes several passes through the memory address space, writing and reading various test patterns repetitively to detect various types of faults. Preferably, the repair algorithm should be able to process the defect data received from the Built-In Self-Test within a couple of clock cycles, because there is a possibility that consecutive addresses may contain defects, or back-to-back errors. It is also desirable to be able to process the defect data quickly to reduce the number of storage elements required to generate a repair solution. If all the defects may be stored, the repair algorithm becomes trivial, however, the extra circuit area and processing time required to determine whether a repair solution exists renders such an approach impractical.

Many fault algorithms are designed to post-process the data, that is, to assign defects after the fault detection data containing the locations of the defective cells has been collected to a specific redundant row or column element. For example, a fault-driven approach is described in "A Fault-driven comprehensive redundancy algorithm for repair of dynamic RAM's", J. R. Day, IEEE Design and Test, Vol. 2, No. 3, 1985, pp. 33–44. Two other post-processing algorithms are described in "Fault-line-covering Approach and an Heuristic Approach Which Requires Calculating Efficient Coefficients for Rows and Columns of the Memory", Wei K. Huang et al., "IEEE Transactions on Computer-aided Design", Vol. 9, No. 3 (March 1990). These and most of other fault algorithms require a large number of iterations, disadvantageously increasing time demands on expensive test resources.

Typically, assignments of defects are not made during the initial pre-processing, or collecting of fault detection data, because of the difficulty in avoiding increased logic area and reduced performance. While some algorithms make simple assignments during the fault detection phase, most of these assignments are limited to only row or only column repairs. For example, if only row repair is used and five defects were found in the same column, five rows would be used to perform the repair. Conversely, if only column repair is used and five defects were found in the same row, five columns would be used to perform the repair. A must column/row repair is defined as finding a repair solution when more defects are found in a row or column than there are available column/row reserve cells.

An advantage of pre-processing the fault data is that the overall area cost may be reduced compared to post-processing techniques. Also, pre-processing the fault data can determine whether a repair solution exists significantly faster than post-processing techniques.

A fault repair algorithm according to an embodiment of the present invention uses a must-repair approach, that is, if the number of defects found in a row (or column) exceeds the number of spare column elements (or row elements), then the defects that exceed the number of spare column elements (or row elements) must be replaced by the corresponding row element (or column element). For example, if a row contains ten defects, and if spare column elements are only available for eight of the ten defects, then the remaining two defects in that row would use extra cells from the spare row elements. A number of physical rows is defined as a row group, or a single redundant row element, and a number of physical columns is defined as a column group, or a single redundant column element. Any number of defects in a single row or column is regarded as a single defect, because the entire row or column containing the one or more defects is replaced by a redundant row or column at the same time.

FIG. 1 illustrates a repair circuit 100 for a redundant memory of the prior art. Shown in FIG. 1 are row group decoders 102, 104, 106, 108, 110 and 112, row muxes 114, 116, 118, 120, 122 and 124, write line drivers 126, 128, 130, 132, 134 and 136, row group decoder outputs 138, 140, 142, 144, 146 and 148, row mux outputs 150, 152, 154, 156, 158 and 160, and write line driver outputs 162, 164, 166, 168, 170 and 172.

In FIG. 1, a defective memory cell, or fault, is detected in row group 2, which is accessed by the row group decoder 108. The repair circuit replaces a defective element by shifting adjacent elements until a redundant element is shifted in to replace the last row or column element as follows. The corresponding row group decoder output 144 is shifted to the next higher row group, former row group 3, by the corresponding row mux 120. The row mux output 154 now routes the row group decoder output 144 to the write line drivers 130 and disables the write line drivers 132 corresponding to the defective row group 2 by setting the write line drivers 132 to the VSS voltage level. The corresponding row group decoder output 142 is likewise shifted to the next higher row group, former row group 4, by the corresponding row mux 118. The row mux output 152 now routes the row group decoder output 142 to the write line drivers 128. Finally, the corresponding row group decoder output 140 is shifted to the next higher row group, the redundant row group, by the corresponding row mux 116. The row mux output 150 now routes the row group decoder output 140 to the write line drivers 126. A similar arrangement is typically used to effect a column repair.

The implementation of a single row redundant element and a single column element is straightforward for a specific segment of memory. It is therefore desirable to partition the memory into several segments, and an additional redundant row group and an additional redundant column group may be used so that shifting may be performed from either side.

FIG. 2 illustrates a partition 200 of a memory array 202 according to an embodiment of the present invention. Shown in FIG. 2 are memory segments 202, 204, 206 and 208.

The memory array is generally partitioned into segments arranged as a two-dimensional matrix. In this example, there are four segments 202, 204, 206 and 208. Each memory address is expressed as a pair of coordinates (x,y) in which the most significant bits (MSB) of the x and y coordinates are used to identify a segment in the partition, and the remaining bits of the x and y coordinates are local coordinates inside the segment.

During fabrication, faults may occur in some of the cells of the memory circuit. To make the entire memory circuit operable, two rows and two columns in the address matrix may be replaced by the reserve cells, subject to the restriction that the segment selection bits, that is, the most significant bits (MSB) of the x and y coordinates, cannot be identical.

FIG. 3 illustrates the partition of the memory array in FIG. 2 for which a repair solution may be found. Shown in FIG. 3 are memory segments 202, 204, 206 and 208, fault locations 302, 304, 306, 308, 310 and 312, vertical lines x1 and x2, and horizontal lines y1 and y2.

In geometrical terms, faults in the four-segment memory array 200 are repairable if they may all be covered by the horizontal line y1 through the segments 202 and 204, by the horizontal line y2 through the segments 206 and 208, by the vertical line x1 through segments 202 and 206, and by the vertical line x2 through segments 204 and 208. In this example, the six defects at all six fault locations are repairable. A repair solution exists if all defects in a memory are repairable. The description of the positions of the four lines x1, x2, y1 and y2 is referred to herein as a fault repair scheme. The algorithm described below for repairing redundant memories can accept sequential x and y coordinate pairs of memory faults, determine whether a repair solution exists, and calculate a corresponding fault repair scheme if one or more possible fault repair solutions exist. The fault repair controller in the example described below applies to a memory partitioned into four segments, and the fault repair controller may be modified to include memories partitioned into more than four segments as will be explained later.

In one aspect of the present invention, a controller for repairing redundant memories includes a fault storage matrix for mapping a repair solution, a plurality of registers for storing row and column coordinates of the repair solution, and a repair solution calculator coupled to the plurality of registers and the fault storage matrix for receiving an x-coordinate and a y-coordinate of a defective memory cell in the redundant memory circuit and for determining whether a repair solution may be found from the fault storage matrix.

FIG. 4 illustrates a pre-processing engine 400 of a fault repair controller for redundant memories according to an embodiment of the present invention. Shown in FIG. 4 are an x-coordinate 402, a y-coordinate 404, a register block 406, a fault storage matrix block 408, write enable signals 410, a clock signal 414, an external clock 416, command signals 418, register coordinates 420, new M1 values 422, a state bus 423, a local index block 424, local index flags 426, an M2 matrix block 428, an M2 matrix 430, an M3 matrix block 432, an M3 matrix 434, a use matrix block 436, a use vector 438, and a new state block 440.

The specific numbers used in the illustrated embodiments of the present invention may be varied to practice other embodiments of the present invention within the scope of the appended claims. In this example, the x-coordinate 402 and the y-coordinate 404 are N-digit and M-digit binary numbers, respectively, where N and M are positive integers.

The amount of memory required is (4N+4M+8), that is, the register block 406 contains four registers each having a length of (N−1) and four registers each having a length of (M−1), and the fault storage matrix block 408 contains a 4×4 fault storage matrix of 16 bits. The X registers are referenced by the names X0, X1, X2 X3, and the Y registers are referenced by the names Y0, Y1, Y2, Y3. The fault storage matrix elements are referenced by M1[i,j], where i,j=0, 1, 2, 3.

The register block 406 may be, for example, an arrangement of (4N+4M−8) flip-flops. The eight write enable lines 410 that correspond to the X registers X0, X1, X2, X3 and the Y registers Y0, Y1, Y2, Y3 are referenced by the names WEX0, WEX1, WEX2 WEX3, and WEY0, WEY1, WEY2, WEY3 respectively. The register coordinates 420 are generated as output on a bus 4 (N+M) bits wide to accommodate the width of four X registers and four Y registers. The clock signal 414 is driven by the external clock 416 and is received as input to the register block 406 and the fault storage matrix block 408. The command signal bus 418 is three bits wide to accommodate the set of commands listed in Table 1 below.

TABLE 1

| COMMAND | FUNCTION |
| --- | --- |
| RST | reset |
| NOP | no operation |
| ADD | add fault at (x, y) |
| GET1 | compute position of 1st horizontal line |
| GET2 | compute position of 2nd horizontal line |
| GET3 | compute position of 1st vertical line |
| GET4 | compute position of 2nd vertical line |

The (4N+4M−8) flip-flops in the register block 406 are referenced by the names FFX0[2], . . . , FFX0[N], FFX1[2], . . . , FFX1[N], FFX2[2], . . . , FFX2[N], FFX3[2], . . . , FFX3[N], FFY0[2], . . . , FFY0[M], FFY1[2], . . . , FFY1[M], FFY2[2], . . . , FFY2[M], and FFY3[2], . . . , FFY3[M]. The flip-flops in the register block 406 are clocked by the clock signal 414. Each group of flip-flops FFX0[2], . . . , FFX0[N], and so on, is controlled by one of the write enable signals WEX0, WEX1, WEX2, WEX3, and WEY0, WEY1, WEY2, WEY3 in combination with the RST or the ADD command signals 418. The most significant bits (MSB) of the x-coordinate 402 and the y-coordinate 404 are not stored in flip-flops, therefore FFX0 [1], and so on, are not used.

The register coordinates 420 are assembled as follows. The MSB's of the registers X0, X1, Y0, Y1 are set to zero, and the MSB's of the registers X2, X3, Y2, Y3 are set to one. The remaining bits of the register coordinates 420 are the corresponding outputs of the flip-flops FFX0[2], . . . , FFX0[N], and so on.

The fault storage block 408 may be, for example, an arrangement of 16 flip-flops. The fault storage block 408 receives as input the clock signal 414, the command signals 418, and the new M1 values 422 for the fault matrix cells M1[i,j]. The write enables of the fault matrix cells M1[i,j] are set to one by the ADD command to latch the new M1 values 422. The reset inputs of the fault matrix cells M1[i,j] are set to one by the RST command so that the outputs of all the matrix cells M1[i,j] are set to zero with each RST command. The outputs of the fault matrix cells M1[i,j] are generated as output on the state bus 423.

The local index block 424 receives as input the x-coordinate 402, the y-coordinate 404, and the register coordinates 420 and generates as output the local index flags 426 that are each set to one if the corresponding condition shown in Table 2 below is satisfied.

TABLE 2

| FLAG | CONDITION |
|---|---|
| I[0] | x = X0 |
| I[1] | x != X0 AND x = X1 |
| I[2] | x = X2 |
| I[3] | x != X2 AND x = X3 |
| I[4] | x != X0 AND x != X1 AND MSB of x = 0 |
| I[5] | x != X2 AND x != X3 AND MSB of x = 1 |
| J[0] | y = Y0 |
| J[1] | y != Y0 AND y = Y1 |
| J[2] | y = Y2 |
| J[3] | y != Y2 AND y = Y3 |
| J[4] | y != Y0 AND y != Y1 AND MSB of y = 0 |
| J[5] | y != Y2 AND y != Y3 AND MSB of y = 1 |

In Table 2, only one I local index flag 426 has a value of one and only one J local index flag 426 has a value of one for each value of the x-coordinate 402 and the y-coordinate 404. The local index block 424, the M2 matrix block 428, the M3 matrix block 432, the use matrix block 436, and the new state block 440 may each be implemented by a logic array according to well-known techniques.

The M2 matrix block 428 receives as input the local index flags 426 and the state bus 423 and computes the M2 matrix 430 M2[i,j], where i,j=0, . . . , 5, according to the following formula:

$$M2[i, j] = 1 \text{ if} \begin{cases} i < 4, \ j < 4, \ \text{AND } M1[i, j] = 1 \text{ OR} \\ I[i] = 1 \text{ AND } J[j] = 1 \end{cases} \quad (1)$$

if neither condition is satisfied, M2[i,j]=0.

The M3 matrix block 432 receives as input the 6×6 M2 matrix 430 and computes the 6×6 M3 matrix 434 M3[i,j], where i,j=0, . . . , 5 as follows. A set of 81 6×6 matrices T=T(i1, i2, j1, j2) is defined where the indices i1 and j1 are each elements of the set {0, 1, 4} and the indices i2 and j2 are each elements of the set {2, 3, 5}. The value of T(i1, i2, j1, j2)[i,j]=1 if at least one of the following four conditions is true: i=i1, or i=i2, or j=j1, or j=j2. If none of these conditions is true, T[i,j]=0. If M2[i,j]<=T(i1, i2, j1, j2)[i,j] for all i,j=0, . . . , 5, then T covers M2. M3[i,j] is set to zero if there exists a matrix T that covers M2 and T[i,j]=0; otherwise, if no such that T exists, or if T[i,j]=1 for all such T, then M3[i,j] is set to one.

The use matrix block 436 receives as input the 6×6 M3 matrix 434 M3[i,j], where i,j=0, . . . , 5 and computes the use vector 438 (UX0, UX1, UX2, UX3, UY0, UY1, UY2, UY3). The use vector 438 represents the current values of the X registers X0, X1, X2, X3 and the Y registers Y0, Y1, Y2, Y3 that may not be altered because they may be necessary for a future repair solution. The use vector 438 corresponds to the rows and columns of the M3 matrix 434 as shown in Table 3 below.

TABLE 3

| SIGNAL | M3 ROW/COL |
|---|---|
| UX0 | M3[0,j] j = 0, . . . , 5 |
| UX1 | M3[1,j] j = 0, . . . , 5 |

TABLE 3-continued

| SIGNAL | M3 ROW/COL |
|---|---|
| UX2 | M3[2,j] j = 0, . . . , 5 |
| UX3 | M3[3,j] j = 0, . . . , 5 |
| UY0 | M3[i,0] i = 0, . . . , 5 |
| UY1 | M3[i,1] i = 0, . . . , 5 |
| UY2 | M3[i,2] i = 0, . . . , 5 |
| UY3 | M3[i,3] i = 0, . . . , 5 |

The value of each of UX0, UX1, UX2, UX3, UY0, UY1, UY2, UY3 is one if the corresponding row or column in the M3 matrix 434 contains all ones, or if the corresponding row or column in the M3 matrix 434 contains a one and the neighboring row or column contains a zero in the corresponding position. For example, UX2=1 if M3[2,0]=M3[2,1]=M3[2,2]=M3[2,3]=1 or if M3[2,1]=1 and M3[3,1]=0. In this context, rows and columns 0 and 1 are neighboring rows and columns, and rows and columns 2 and 3 are neighboring rows and columns.

The new state block 440 receives as input the command signals 418, the use vector 438 and the M3 matrix 434 and generates the write enable signals 410 and the new M1 values 422. The write enable signals 410 WEX0, WEX1, WEX2, WEX3, and WEY0, WEY1, WEY2, WEY3 are the negation of the values UX0, UX1, UX2, UX3, UY0, UY1, UY2, UY3, respectively. For example, if UX0=1, then WEX0=~UX0=0, and so on. The new M1 values 422 are defined by formula (2):

$$M1[i,j]=M3[i,j] \lor (T1 \land M3[i',j]) \lor (T2 \land M3[i,j']) \lor (T1 \land T2 \land T2 \land M3[i',j']) \quad (2)$$

where i'=f(i), j'=f(j), T1=T1(i), and T2=T2(j) are defined as shown in Table 4 below.

TABLE 4

| k | f(k) | T1(k) | T2(k) |
|---|---|---|---|
| 0 | 4 | ~UX0 | ~UY0 |
| 1 | 4 | UX0 | UY0 |
| 2 | 5 | ~UX2 | ~UY2 |
| 3 | 5 | UX2 | UY2 |

The new M1 values 422 are loaded into the M1 matrix by the fault storage matrix block 408, and the write enable signals 410 select which X and Y registers will be modified by the x- and y-coordinates of the current fault. The fault repair controller is then ready to receive the x- and y-coordinates of the next fault.

As each fault location is received, a post-processing engine determines whether a repair solution exists as follows.

FIG. 5 illustrates a post-processing engine 500 according to an embodiment of the present invention. Shown in FIG. 5 are the command signals 418, the register coordinates 420, the state bus 423, a repair scheme block 502, an error signal 504, selector signals 506, an output value block 508, and output values 510.

The repair scheme block 502 receives as input the M1 fault storage matrix and generates as output the error signal 504 and the selector signals 506 as follows. A set of 16 4×4 matrices W=W(i1, i2, j1, j2) is defined where i1 and j1 are elements of the set {0,1} and i2 and j2 are elements of the set {2,3}. The value of W(i1, i2, j1, j2)[i,j] is set to one if at least one of the following four conditions is true: i=i1 or i=i2, or j=j1, or j=j2. If none of these conditions is satisfied, W[i,j] is set to zero. If M1[i,j]<=W[i,j] for all i,j=0, . . . , 3, then W covers M1. If there exists no matrix W=W(i1, i2, j1, j2) such that W covers M1, then ERR is set to one to indicate that no repair solution exists. If there does exist a matrix W that covers the matrix M1, then ERR is set to zero to indicate that a repair solution exists. XLO is set to one if i1 is odd, XHI is set to one if i2 is odd, YLO is set to one if j1 is odd, and YHI is set to one if j2 is odd, where i1, i2, j1, j2 correspond to the indices in the matrix W(i1, i2, j1, j2) that covers the M1 matrix. If there are multiple matrices W(i1, i2, j1, j2) that cover the M1 matrix, then all four indices i1, i2, j1 and j2 correspond to the indices of only one of the multiple matrices W(i1, i2, j1, j2) that cover the M1 matrix.

The output value block 508 receives as input the command signals 418, the selector signals 506 and the state bus 423 and generates as output the output values 510 corresponding to the row and column coordinates of the repair solution. The width of the output values bus 510 is max(N, M). The values of the selector signals 506 are a packed form of the fault repair solution, and the actual values of the repair scheme (x1, x2, y1, y2) may be read from the output value block 508 using the values of XLO, XHI, YLO, YHI with the X and Y registers as shown in Table 5 below.

TABLE 5

| COMMAND | SELECTOR SIGNAL | OUTPUT VALUE |
| --- | --- | --- |
| GET1 | XLO = 0 | Y0 |
| GET1 | XLO = 1 | Y1 |
| GET2 | XHI = 0 | Y2 |
| GET2 | XHI = 1 | Y3 |
| GET3 | YLO = 0 | X0 |
| GET3 | YLO = 1 | X1 |
| GET4 | YHI = 0 | X2 |
| GET4 | YHI = 1 | X3 |

The repair scheme block 502 and the output value block 508 may each be implemented by a logic array according to well-known techniques.

The local index block 424, the M2 matrix block 428, the M3 matrix block 432, the use matrix block 436, the new state block 440, the repair scheme block 502, and the output value block 508 constitute a repair solution calculator that maps the defective cells in the fault storage matrix block 408 and stores the row and column coordinates of the repair solution in the register block 406.

In operation, a RST command initially resets the fault storage matrix to all zeroes. During self-test, a NOP command is received from the Built-In Self-Test for each x-coordinate and y-coordinate of a memory location that passes the self-test, while an ADD command is received from the Built-In Self-Test for each x-coordinate and y-coordinate of a memory location that fails the self-test. The ADD command results in storing the x-coordinate and y-coordinate of each fault in the X and Y registers and the locations of the faults in the M1 fault storage matrix. After each fault is added, the fault repair controller determines whether a repair solution exists and sends the ERR signal to the Built-In Self-Test. If the ERR signal indicates that a repair solution does not exist, the memory chip cannot be repaired, and the self-test may be terminated to save test time. If the ERR signal indicates that a repair solution does exist, the Built-In Self-Test reads the repair solution from the X and Y registers of the fault repair controller using the GET commands GET1, GET2, GET3 and GET4.

In the following example, N=3, and locations [1], . . . , [8] contain a sequence of detected faults. The fault storage matrix M1 for this example is illustrated in Table 6 below.

TABLE 6

| Y\X | 000 | 001 | 010 | 011 | 100 | 101 | 110 | 111 |
| --- | --- | --- | --- | --- | --- | --- | --- | --- |
| 000 | [-] | [-] | [-] | [-] | [-] | [-] | [-] | [-] |
| 001 | [-] | [7] | [-] | [-] | [-] | [-] | [-] | [-] |
| 010 | [-] | [-] | [1] | [-] | [-] | [-] | [-] | [5] |
| 011 | [-] | [-] | [-] | [-] | [-] | [2] | [-] | [-] |
| 100 | [-] | [-] | [-] | [-] | [-] | [-] | [-] | [-] |
| 101 | [-] | [-] | [-] | [-] | [-] | [-] | [-] | [8] |
| 110 | [6] | [-] | [3] | [-] | [-] | [4] | [-] | [-] |
| 111 | [-] | [-] | [-] | [-] | [-] | [-] | [-] | [-] |

Initially, the reset command fills the M1 matrix with zeroes, however, the registers X0, . . . , X3, Y0, . . . , Y3 may contain random values, for example: X0=001, X1=011, X2=111, X3=100, Y0=010, Y1=010, Y2=100, Y3=111. As explained above, the MSB's of the registers X0, X1, Y0, Y1 are set to zero, and the MSB's of the registers X2, X3, Y2, Y3 are set to one.

The first fault repair scheme in lexicographical order may be expressed by the formula:

$$W(0, 2, 0, 2) = \begin{matrix} 1 & 1 & 1 & 1 \\ 1 & 0 & 1 & 0 \\ 1 & 1 & 1 & 1 \\ 1 & 0 & 1 & 0 \end{matrix} \quad (3)$$

where ERR=0, YLO=YHI=XLO=XHI=0, and possible output values 510 after performing the commands GET1 . . . GET4 are 010, 100, 001, 111.

After adding the first fault [1] at x=010, y=010 in Table 6, the local index flags 426 I[ ]=0, 0, 0, 0, 1, 0 and J[ ]=1, 0, 0, 0, 0, 0 are computed by the local index block 424. The M2 matrix 430 calculated by the M2 matrix block 428 is given by Table 7 below.

TABLE 7

| j\i | 0 | 1 | 2 | 3 | 4 | 5 |
| --- | --- | --- | --- | --- | --- | --- |
| 0 | 0 | 0 | 0 | 0 | 1 | 0 |
| 1 | 0 | 0 | 0 | 0 | 0 | 0 |
| 2 | 0 | 0 | 0 | 0 | 0 | 0 |
| 3 | 0 | 0 | 0 | 0 | 0 | 0 |
| 4 | 0 | 0 | 0 | 0 | 0 | 0 |
| 5 | 0 | 0 | 0 | 0 | 0 | 0 |

The M3 matrix 434 calculated by the M3 matrix block 432 is given by Table 8 below.

TABLE 8

| j\i | 0 | 1 | 2 | 3 | 4 | 5 |
|---|---|---|---|---|---|---|
| 0 | 0 | 0 | 0 | 0 | 1 | 0 |
| 1 | 0 | 0 | 0 | 0 | 0 | 0 |
| 2 | 0 | 0 | 0 | 0 | 0 | 0 |
| 3 | 0 | 0 | 0 | 0 | 0 | 0 |
| 4 | 0 | 0 | 0 | 0 | 0 | 0 |
| 5 | 0 | 0 | 0 | 0 | 0 | 0 |

There are 45 possible combinations (i1, i2, j1, j2) for which T(i1, i2, j1, j2) covers M2, namely (4, *, *, *) (27 variants) plus (*, *, 0, *) (27 variants), however, nine variants of (4, *, *, *) are included twice, so that the total is given by 27+27−9=45.

The use matrix block 436 generates the use vector 438 as follows: UX0=0, UX1=0, UX2=0, UX3=0, UY0=1, UY1=0, UY2=0, UY3=0.

The new state block 440 generates the write enable signals 410, new values of the X and Y registers, and the new M1 values 422 as follows: WEX0=1, WEX1=1, WEX2=1, WEX3=1, WEY0=0, WEY1=1, WEY2=1, WEY3=1; X0=010, X1=010, X2=110, X3=110, Y0=010, Y1=010, Y2=110, Y3=110;

$$M1 = \begin{matrix} 1 & 0 & 0 & 0 \\ 0 & 0 & 0 & 0 \\ 0 & 0 & 0 & 0 \\ 0 & 0 & 0 & 0 \end{matrix} \qquad (4)$$

The first fault repair scheme is still therefore $$W(0, 2, 0, 2) = \begin{matrix} 1 & 1 & 1 & 1 \\ 1 & 0 & 1 & 0 \\ 1 & 1 & 1 & 1 \\ 1 & 0 & 1 & 0 \end{matrix} \qquad (5)$$

where ERR=0, YLO=YHI=XLO=XHI=0, and possible output values 510 after performing the commands GET1 . . . GET4 are 010, 110, 010, 110.

After adding the second fault [2] at x=101, y=011 in Table 6, the local index flags 426 I[ ]=0, 0, 0, 0, 0, 1 and J[ ]=0, 0, 0, 0, 1, 0 are computed by the local index block 424. The M2 matrix 430 calculated by the M2 matrix block 428 is given by Table 9 below.

TABLE 9

| j\i | 0 | 1 | 2 | 3 | 4 | 5 |
|---|---|---|---|---|---|---|
| 0 | 1 | 0 | 0 | 0 | 0 | 0 |
| 1 | 0 | 0 | 0 | 0 | 0 | 0 |
| 2 | 0 | 0 | 0 | 0 | 0 | 0 |
| 3 | 0 | 0 | 0 | 0 | 0 | 0 |
| 4 | 0 | 0 | 0 | 0 | 0 | 1 |
| 5 | 0 | 0 | 0 | 0 | 0 | 0 |

The M3 matrix 434 calculated by the M3 matrix block 432 is given by Table 10 below.

TABLE 10

| j\i | 0 | 1 | 2 | 3 | 4 | 5 |
|---|---|---|---|---|---|---|
| 0 | 1 | 0 | 0 | 0 | 0 | 0 |
| 1 | 0 | 0 | 0 | 0 | 0 | 0 |
| 2 | 0 | 0 | 0 | 0 | 0 | 0 |
| 3 | 0 | 0 | 0 | 0 | 0 | 0 |
| 4 | 0 | 0 | 0 | 0 | 0 | 1 |
| 5 | 0 | 0 | 0 | 0 | 0 | 0 |

There are 21 possible combinations (i1, i2, j1, j2) for which T(i1, i2, j1, j2) covers M2, namely (*, 5, 0, *) (9 variants) plus (0, 5, 1, *) (3 variants) plus (0, *, 4, *) (9 variants).

The use matrix block 436 generates the use vector 438 as follows: UX0=1, UX1=0, UX2=0, UX3=0, UY0=1, UY1=0, UY2=0, UY3=0.

The new state block 440 generates the write enable signals 410, new values of the X and Y registers, and the new M1 values 422 as follows: WEX0=0, WEX1=1, WEX2=1, WEX3=1, WEY0=0, WEY1=1, WEY2=1, WEY3=1; X0=010, X1=001, X2=101, X3=101, Y0=010, Y1=011, Y2=111, Y3=111;

$$M1 = \begin{matrix} 1 & 0 & 0 & 0 \\ 0 & 0 & 1 & 0 \\ 0 & 0 & 0 & 0 \\ 0 & 0 & 0 & 0 \end{matrix} \qquad (6)$$

The first fault repair scheme is still therefore $$W(0, 2, 0, 2) = \begin{matrix} 1 & 1 & 1 & 1 \\ 1 & 0 & 1 & 0 \\ 1 & 1 & 1 & 1 \\ 1 & 0 & 1 & 0 \end{matrix} \qquad (7)$$

where ERR=0, YLO=YHI=XLO=XHI=0, and possible output values 510 after performing the commands GET1 . . . GET4 are 010, 111, 010, 101.

After adding the third fault [3] at x=010, y=110 in Table 6, the local index flags 426 I[ ]=1, 0, 0, 0, 0, 0 and J[ ]=0, 0, 0, 0, 0, 1 are computed by the local index block 424. The M2 matrix 430 calculated by the M2 matrix block 428 is given by Table 11 below.

TABLE 11

| j\i | 0 | 1 | 2 | 3 | 4 | 5 |
|---|---|---|---|---|---|---|
| 0 | 1 | 0 | 0 | 0 | 0 | 0 |
| 1 | 0 | 0 | 1 | 0 | 0 | 0 |
| 2 | 0 | 0 | 0 | 0 | 0 | 0 |
| 3 | 0 | 0 | 0 | 0 | 0 | 0 |
| 4 | 0 | 0 | 0 | 0 | 0 | 0 |
| 5 | 1 | 0 | 0 | 0 | 0 | 0 |

The M3 matrix 434 calculated by the M3 matrix block 432 is given by Table 12 below.

TABLE 12

| j\i | 0 | 1 | 2 | 3 | 4 | 5 |
|---|---|---|---|---|---|---|
| 0 | 1 | 0 | 0 | 0 | 0 | 0 |
| 1 | 0 | 0 | 1 | 0 | 0 | 0 |
| 2 | 0 | 0 | 0 | 0 | 0 | 0 |
| 3 | 0 | 0 | 0 | 0 | 0 | 0 |
| 4 | 0 | 0 | 0 | 0 | 0 | 0 |
| 5 | 1 | 0 | 0 | 0 | 0 | 0 |

There are 17 possible combinations (i1, i2, j1, j2) for which T(i1, i2, j1, j2) covers M2, namely (0, 2, *, *) (9 variants) plus (0, 3, 1, *) (3 variants) plus (0, 5, 1, *) (3 variants) plus (1, 2, 0, 5) (1 variant) plus (4, 2, 0, 5) (1 variant).

The use matrix block 436 generates the use vector 438 as follows: UX0=1, UX1=0, UX2=1, UX3=0, UY0=1, UY1=1, UY2=0, UY3=0.

The new state block 440 generates the write enable signals 410, new values of the X and Y registers, and the new M1 values 422 as follows: WEX0=0, WEX1=1, WEX2=0, WEX3=1, WEY0=0, WEY1=0, WEY2=1, WEY3=1; X0=010, X1=010, X2=101, X3=110, Y0=010, Y1=011, Y2=110, Y3=110;

$$M1 = \begin{matrix} 1 & 0 & 0 & 0 \\ 0 & 0 & 1 & 0 \\ 1 & 0 & 0 & 0 \\ 0 & 0 & 0 & 0 \end{matrix} \quad (8)$$

The first fault repair scheme is still therefore $$W(0, 2, 0, 2) = \begin{matrix} 1 & 1 & 1 & 1 \\ 1 & 0 & 1 & 0 \\ 1 & 1 & 1 & 1 \\ 1 & 0 & 1 & 0 \end{matrix} \quad (9)$$

where ERR=0, YLO=YHI=XLO=XHI=0, and possible output values 510 after performing the commands GET1 . . . GET4 are 010, 110, 010, 101.

After adding the fourth fault [4] at x=101, y=110 in Table 6, the local index flags 426 I[ ]=0, 0, 1, 0, 0, 0 and J[ ]=0, 0, 1, 0, 0, 0 are computed by the local index block 424. The M2 matrix 430 calculated by the M2 matrix block 428 is given by Table 13 below.

TABLE 13

| j\i | 0 | 1 | 2 | 3 | 4 | 5 |
|---|---|---|---|---|---|---|
| 0 | 1 | 0 | 0 | 0 | 0 | 0 |
| 1 | 0 | 0 | 1 | 0 | 0 | 0 |
| 2 | 1 | 0 | 1 | 0 | 0 | 0 |
| 3 | 0 | 0 | 0 | 0 | 0 | 0 |
| 4 | 0 | 0 | 0 | 0 | 0 | 0 |
| 5 | 0 | 0 | 0 | 0 | 0 | 0 |

The M3 matrix 434 calculated by the M3 matrix block 432 is given by Table 14 below.

TABLE 14

| j\i | 0 | 1 | 2 | 3 | 4 | 5 |
|---|---|---|---|---|---|---|
| 0 | 1 | 0 | 0 | 0 | 0 | 0 |
| 1 | 0 | 0 | 1 | 0 | 0 | 0 |
| 2 | 1 | 0 | 1 | 0 | 0 | 0 |
| 3 | 0 | 0 | 0 | 0 | 0 | 0 |
| 4 | 0 | 0 | 0 | 0 | 0 | 0 |
| 5 | 0 | 0 | 0 | 0 | 0 | 0 |

There are 13 possible combinations (i1, i2, j1, j2) for which T(i1, i2, j1, j2) covers M2, namely (0, 2, *, *) (9 variants) plus (0, 3, 1, 2) (1 variant) plus (0, 5, 1, 2) (1 variant) plus (1, 2, 0, 2) (1 variant) plus (4, 2, 0, 2) (1 variant).

The use matrix block 436 generates the use vector 438 as follows: UX0=1, UX1=0, UX2=1, UX3=0, UY0=1, UY1=1, UY2=1, UY3=0.

The new state block 440 generates the write enable signals 410, new values of the X and Y registers, and the new M1 values 422 as follows: WEX0=0, WEX1=1, WEX2=0, WEX3=1, WEY0=0, WEY1=0, WEY2=0, WEY3=1; X0=010, X1=001, X2=101, X3=101, Y0=010, Y1=011, Y2=110, Y3=110;

$$M1 = \begin{matrix} 1 & 0 & 0 & 0 \\ 0 & 0 & 1 & 0 \\ 1 & 0 & 1 & 0 \\ 0 & 0 & 0 & 0 \end{matrix} \quad (8)$$

The first fault repair scheme is still therefore $$W(0, 2, 0, 2) = \begin{matrix} 1 & 1 & 1 & 1 \\ 1 & 0 & 1 & 0 \\ 1 & 1 & 1 & 1 \\ 1 & 0 & 1 & 0 \end{matrix} \quad (9)$$

where ERR=0, YLO=YHI=XLO=XHI=0, and possible output values 510 after performing the commands GET1 . . . GET4 are 010, 110, 010, 101.

After adding the fifth fault [5] at x=111, y=010 in Table 6, the local index flags 426 I[ ]=0, 0, 0, 0, 0, 1 and J[ ]=1, 0, 0, 0, 0, 0 are computed by the local index block 424. The M2 matrix 430 calculated by the M2 matrix block 428 is given by Table 15 below.

TABLE 15

| j\i | 0 | 1 | 2 | 3 | 4 | 5 |
|---|---|---|---|---|---|---|
| 0 | 1 | 0 | 0 | 0 | 0 | 1 |
| 1 | 0 | 0 | 1 | 0 | 0 | 0 |
| 2 | 1 | 0 | 1 | 0 | 0 | 0 |
| 3 | 0 | 0 | 0 | 0 | 0 | 0 |
| 4 | 0 | 0 | 0 | 0 | 0 | 0 |
| 5 | 0 | 0 | 0 | 0 | 0 | 0 |

The M3 matrix 434 calculated by the M3 matrix block 432 is given by Table 16 below.

TABLE 16

| j\i | 0 | 1 | 2 | 3 | 4 | 5 |
|---|---|---|---|---|---|---|
| 0 | 1 | 0 | 0 | 0 | 0 | 1 |
| 1 | 0 | 0 | 1 | 0 | 0 | 0 |
| 2 | 1 | 0 | 1 | 0 | 0 | 0 |
| 3 | 0 | 0 | 0 | 0 | 0 | 0 |
| 4 | 0 | 0 | 0 | 0 | 0 | 0 |
| 5 | 0 | 0 | 0 | 0 | 0 | 0 |

There are 6 possible combinations (i1, i2, j1, j2) for which T(i1, i2, j1, j2) covers M2, namely (0, 2, 0, *) (3 variants) plus (0, 5, 1, 2) (1 variant) plus (1, 2, 0, 2) (1 variant) plus (4, 2, 0, 2) (1 variant).

The use matrix block 436 generates the use vector 438 as follows: UX0=1, UX1=0, UX2=1, UX3=0, UY0=1, UY1=1, UY2=1, UY3=0.

The new state block 440 generates the write enable signals 410, new values of the X and Y registers, and the new M1 values 422 as follows: WEX0=0, WEX1=1, WEX2=0, WEX3=1, WEY0=0, WEY1=0, WEY2=0, WEY3=1; X0=010, X1=011, X2=101, X3=111, Y0=010, Y1=011, Y2=110, Y3=110;

$$M1 = \begin{matrix} 1 & 0 & 0 & 0 \\ 0 & 0 & 1 & 0 \\ 1 & 0 & 1 & 0 \\ 0 & 0 & 0 & 0 \end{matrix} \quad (8)$$

The first fault repair scheme is still therefore $$W(0, 2, 0, 2) = \begin{matrix} 1 & 1 & 1 & 1 \\ 1 & 0 & 1 & 0 \\ 1 & 1 & 1 & 1 \\ 1 & 0 & 1 & 0 \end{matrix} \quad (9)$$

where ERR=0, YLO=YHI=XLO=XHI=0, and possible output values 510 after performing the commands GET1 . . . GET4 are 010, 110, 010, 101.

After adding the sixth fault [6] at x=000, y=110 in Table 6, the local index flags 426 I[ ]=0, 0, 0, 0, 1, 0 and J[ ]=0, 0, 1, 0, 0, 0 are computed by the local index block 424. The M2 matrix 430 calculated by the M2 matrix block 428 is given by Table 17 below.

TABLE 17

| j\i | 0 | 1 | 2 | 3 | 4 | 5 |
|---|---|---|---|---|---|---|
| 0 | 1 | 0 | 0 | 1 | 0 | 0 |
| 1 | 0 | 0 | 1 | 0 | 0 | 0 |
| 2 | 1 | 0 | 1 | 0 | 1 | 0 |
| 3 | 0 | 0 | 0 | 0 | 0 | 0 |
| 4 | 0 | 0 | 0 | 0 | 0 | 0 |
| 5 | 0 | 0 | 0 | 0 | 0 | 0 |

The M3 matrix 434 calculated by the M3 matrix block 432 is given by Table 18 below.

TABLE 18

| j\i | 0 | 1 | 2 | 3 | 4 | 5 |
|---|---|---|---|---|---|---|
| 0 | 1 | 0 | 0 | 1 | 0 | 0 |
| 1 | 0 | 0 | 1 | 0 | 0 | 0 |
| 2 | 1 | 1 | 1 | 1 | 1 | 1 |
| 3 | 0 | 0 | 0 | 0 | 0 | 0 |
| 4 | 0 | 0 | 0 | 0 | 0 | 0 |
| 5 | 0 | 0 | 0 | 0 | 0 | 0 |

There are 4 possible combinations (i1, i2, j1, j2) for which T(i1, i2, j1, j2) covers M2, namely (0, 3, 1, 2) (1 variant) plus (*, 2, 0, 2) (3 variants).

The corresponding matrices T(i1, i2, j1, j2) are given by:

100100 111111 111111 111111
111111 101000 011000 001010
111111 111111 111111 111111
100100 101000 011000 001010
100100 101000 011000 001010
100100 101000 011000 001010

The use matrix block 436 generates the use vector 438 as follows: UX0=1, UX1=0, UX2=1, UX3=1, UY0=1, UY1=1, UY2=1, UY3=0.

The new state block 440 generates the write enable signals 410, new values of the X and Y registers, and the new M1 values 422 as follows: WEX0=0, WEX1=1, WEX2=0, WEX3=0, WEY0=0, WEY1=0, WEY2=0, WEY3=1; X0=010, X1=000, X2=101, X3=111, Y0=010, Y1=011, Y2=110, Y3=110;

$$M1 = \begin{matrix} 1 & 0 & 0 & 0 \\ 0 & 0 & 1 & 0 \\ 1 & 1 & 1 & 1 \\ 0 & 0 & 0 & 0 \end{matrix} \quad (10)$$

The first fault repair scheme is still therefore $$W(0, 2, 0, 2) = \begin{matrix} 1 & 1 & 1 & 1 \\ 1 & 0 & 1 & 0 \\ 1 & 1 & 1 & 1 \\ 1 & 0 & 1 & 0 \end{matrix} \quad (11)$$

where ERR=0, YLO=YHI=XLO=XHI=0, and possible output values 510 after performing the commands GET1 . . . GET4 are 010, 110, 010, 101.

After adding the seventh fault [7] at x=001, y=001 in Table 6, the local index flags 426 I[ ]=0, 0, 0, 0, 1, 0 and J[ ]=0, 0, 0, 0, 0, 0 are computed by the local index block 424. The M2 matrix 430 calculated by the M2 matrix block 428 is given by Table 19 below.

TABLE 19

| j\i | 0 | 1 | 2 | 3 | 4 | 5 |
|-----|---|---|---|---|---|---|
| 0   | 1 | 0 | 0 | 1 | 0 | 0 |
| 1   | 0 | 0 | 1 | 0 | 0 | 0 |
| 2   | 1 | 1 | 1 | 1 | 0 | 0 |
| 3   | 0 | 0 | 0 | 0 | 0 | 0 |
| 4   | 0 | 0 | 0 | 0 | 1 | 0 |
| 5   | 0 | 0 | 0 | 0 | 0 | 0 |

The M3 matrix 434 calculated by the M3 matrix block 432 is given by Table 20 below.

TABLE 20

| j\i | 0 | 1 | 2 | 3 | 4 | 5 |
|-----|---|---|---|---|---|---|
| 0   | 1 | 0 | 0 | 1 | 0 | 0 |
| 1   | 0 | 0 | 1 | 0 | 0 | 0 |
| 2   | 1 | 1 | 1 | 1 | 1 | 1 |
| 3   | 0 | 0 | 0 | 0 | 0 | 0 |
| 4   | 0 | 0 | 0 | 0 | 0 | 0 |
| 5   | 0 | 0 | 0 | 0 | 0 | 0 |

There is only one possible combination (i1, i2, j1, j2) for which T(i1, i2, j1, j2) covers M2, namely (4, 2, 0, 2), so the M3 matrix is equal to T(4, 2, 0, 2).

The use matrix block 436 generates the use vector 438 as follows: UX0=0, UX1=0, UX2=1, UX3=0, UY0=1, UY1=0, UY2=1, UY3=0.

The new state block 440 generates the write enable signals 410, new values of the X and Y registers, and the new M1 values 422 as follows: WEX0=1, WEX1=1, WEX2=0, WEX3=1, WEY0=0, WEY1=1, WEY2=0, WEY3=1; X0=001, X1=001, X2=101, X3=101, Y0=010, Y1=001, Y2=110, Y3=101;

$$M1 = \begin{matrix} 1 & 1 & 1 & 1 \\ 1 & 0 & 1 & 0 \\ 1 & 1 & 1 & 1 \\ 1 & 0 & 1 & 0 \end{matrix} \quad (12)$$

The first fault repair scheme is still therefore $$W(0, 2, 0, 2) = \begin{matrix} 1 & 1 & 1 & 1 \\ 1 & 0 & 1 & 0 \\ 1 & 1 & 1 & 1 \\ 1 & 0 & 1 & 0 \end{matrix} \quad (13)$$

where ERR=0, YLO=YHI=XLO=XHI=0, and possible output values 510 after performing the commands GET1 . . . GET4 are 010, 110, 001, 101.

After adding the eighth fault [8] at x=111, y=101 in Table 6, the local index flags 426 I[ ]=0, 0, 0, 0, 0, 1 and J[ ]=0, 0, 0, 1, 0, 0 are computed by the local index block 424. The M2 matrix 430 calculated by the M2 matrix block 428 is given by Table 21 below.

TABLE 21

| j\i | 0 | 1 | 2 | 3 | 4 | 5 |
|---|---|---|---|---|---|---|
| 0 | 1 | 1 | 1 | 1 | 0 | 0 |
| 1 | 1 | 0 | 1 | 0 | 0 | 0 |
| 2 | 1 | 1 | 1 | 1 | 0 | 0 |
| 3 | 1 | 0 | 1 | 0 | 0 | 1 |
| 4 | 0 | 0 | 0 | 0 | 0 | 0 |
| 5 | 0 | 0 | 0 | 0 | 0 | 0 |

The M3 matrix 434 calculated by the M3 matrix block 432 is given by Table 22 below.

TABLE 22

| j\i | 0 | 1 | 2 | 3 | 4 | 5 |
|---|---|---|---|---|---|---|
| 0 | 1 | 1 | 1 | 1 | 1 | 1 |
| 1 | 1 | 1 | 1 | 1 | 1 | 1 |
| 2 | 1 | 1 | 1 | 1 | 1 | 1 |
| 3 | 1 | 1 | 1 | 1 | 1 | 1 |
| 4 | 1 | 1 | 1 | 1 | 1 | 1 |
| 5 | 1 | 1 | 1 | 1 | 1 | 1 |

There no possible combinations (i1, i2, j1, j2) for which T(i1, i2, j1, j2) covers M2.

The use matrix block 436 generates the use vector 438 as follows: UX0=1, UX1=1, UX2=1, UX3=1, UY0=1, UY1=1, UY2=1, UY3=1.

The new state block 440 generates the write enable signals 410, new values of the X and Y registers, and the new M1 values 422 as follows: WEX0=0, WEX1=0, WEX2=0, WEX3=0, WEY0=0, WEY1=0, WEY2=0, WEY3=0; X0=001, X1=001, X2=101, X3=101, Y0=010, Y1=001, Y2=110, Y3=101;

$$M1 = \begin{matrix} 1 & 1 & 1 & 1 \\ 1 & 1 & 1 & 1 \\ 1 & 1 & 1 & 1 \\ 1 & 1 & 1 & 1 \end{matrix} \quad (14)$$

At this point no fault repair scheme exits, therefore ERR is set to 1 to signal that the memory chip cannot be repaired. If the Built-In Self-Test attempts to add any further faults, the fault repair controller will generate the following results:

$$M2 = \begin{matrix} 1 & 1 & 1 & 1 & ? & ? \\ 1 & 1 & 1 & 1 & ? & ? \\ 1 & 1 & 1 & 1 & ? & ? \\ 1 & 1 & 1 & 1 & ? & ? \\ ? & ? & ? & ? & ? & ? \\ ? & ? & ? & ? & ? & ? \end{matrix} \quad (15)$$

$$M3 = \begin{matrix} 1 & 1 & 1 & 1 & 1 & 1 \\ 1 & 1 & 1 & 1 & 1 & 1 \\ 1 & 1 & 1 & 1 & 1 & 1 \\ 1 & 1 & 1 & 1 & 1 & 1 \\ 1 & 1 & 1 & 1 & 1 & 1 \\ 1 & 1 & 1 & 1 & 1 & 1 \end{matrix} \quad (16)$$

UX0=1, UX1=1, UX2=1, UX3=1, UY0=1, UY1=1, UY2=1, UY3=1; WEX0=0, WEX1=0, WEX2=0, WEX3=0, WEY0=0, WEY1=0, WEY2=0, WEY3=0, without changes in the values of X0, . . . , X3, Y0, . . . , Y3, and ERR=1.

In another aspect of the present invention, the functions of the fault repair controller described above are implemented in a method of repairing faults in a redundant memory as follows.

FIG. 6 illustrates a flow chart 600 for a method of repairing faults in a redundant memory according to an embodiment of the present invention.

Step 602 is the entry point of the flow chart 600.

In step 604, a fault storage matrix for storing a repair solution is initialized, for example, to zero.

In step 606 an x-coordinate and a y-coordinate of a defective memory cell is received, for example, from the built-in self-test.

In step 608, a calculation of a repair solution is attempted from the fault storage matrix to determine whether a repair solution may be found as explained above;

In step 610, if a repair solution is found, then control is transferred to step 612, otherwise control is transferred to step 620.

In step 612, the repair solution is mapped in the fault storage matrix.

In step 614, the row and column coordinates corresponding to the repair solution are stored in a block of X and Y registers.

In step 616, if another defective memory cell is to be added to the repair solution, then control is transferred to step 606, otherwise control is transferred to step 618.

In step 618, an error flag is set to indicate that the repair solution is ready.

In step 620, the repair solution is generated as output from the block of X and Y registers, and control is transferred to step 624.

In step 622, the error flag is set to indicate that no further fault detection processing need be performed and that the memory cannot be repaired.

Step 624 is the exit point of the flow chart 600.

In another aspect of the present invention, the fault repair controller of FIGS. 4 and 5 described above may be modified for a memory array that is partitioned into more than the 2×2 segments in the example illustrated. For example, the memory may be partitioned into K horizontal strips and L vertical strips with one correction line for each segment. The modifications to the fault repair controller for a memory having K horizontal segments and L vertical segments with one correction line may be made as follows:

(1) Divide the bits in each address component x and y into an upper portion and a lower portion. The upper portion identifies the strip number, and the lower portion represents the address inside the strip. In the previous example, it was 1+(N−1) and 1+(M−1). If simple bit separation is not practical, some recoding of the addresses may be used. For example, if the range of x values is 0, . . . , 98, that is, x has 7 bits, and the address partitioning is 99=33+33+33, then one possible recoding of x is:

$x_{upper} = x/33$ (integer division)

$x_{lower} = x \bmod 33$                                                           (17)

where $x_{upper}$ has two bits and $x_{lower}$ has six bits.

(2) Include 2K*L registers for x-coordinates and K*L registers for y-coordinates, that is, L groups of X registers having K registers in each group and K groups of Y registers having L registers in each group.

(3) Dimension the M1 matrix with K*L rows and K*L columns.

(4) Include (K*L+L) I[i] flags and (K*L+K) J[j] flags.

(5) Dimension the M2 and M3 matrices with (K*L+L) columns and (K*L+K) rows, that is, one extra column for each of L vertical strips and one extra row for each of K horizontal strips.

(6) Create variables UXi, UYj, WEXi, WEYj, where i=1, ..., L and j=1, ..., K.

(7) Instead of the pairs of one-bit selectors (XLO, XHI) and (YLO, YHI), include L X-selectors XS[1], ..., XS[L] each having one of K possible values and K Y-selectors YS[1], ..., YS[K] each having one of L possible values.

(8) Dimension the width of the command signals bus 418 to include GET commands for each of the X and Y registers.

(9) The local index block 424 calculates the I[i] flags and the J[j] flags as follows. If the current x-coordinate 402 equals one of the X registers, then the I[i] flag corresponding to the first such X register is set to one. If the current x-coordinate 402 is a "new" x-coordinate, then the "active" I[i] flag must mark the corresponding vertical segment. In the same manner, the J[j] flags are set for the y-coordinates.

(10) Instead of using two sets of possible values for i1, j1 and i2, j2, respectively, in the M3 matrix block 432, separate sets of possible values SI for each i and SJ for each j are defined according to formula (18) as follows:

$$\begin{aligned}
SI1 &= \{0, 1, \ldots, K-1, KL\} \\
SI2 &= \{K, K+1, \ldots, 2K-1, KL+1\} \\
SI3 &= \{2K, 2K+1, \ldots, 3K-1, KL+2\} \\
&\vdots \\
SIL &= \{(L-1)K, (L-1)K+1, \ldots, LK-1, Kl+l-1\} \\
SJ1 &= \{0, 1, \ldots, L-1, KL\} \\
SJ2 &= \{L, L+1, \ldots, 2L-1, KL+1\} \\
SJ3 &= \{2L, 2L+1, \ldots, 3L-1, KL+2\} \\
&\vdots \\
SJK &= \{(K-1)L, (K-1)L+1, \ldots, KL-1, KL+K-1\}
\end{aligned}$$  (18)

If K equals L, then the sets SI are identical to the sets SJ. Each set SI1, ..., SIL, SJ1, ..., SJK defines the possible values for each corresponding index in the matrices T(i1, ..., iL, j1, ...jK).

(11) The use matrix block 436 generates the use vector 438 UXi, (i=0, ..., L−1), UYj (j=0, ..., K−1) as follows:

(a) if the corresponding column i (or row j) in the M3 matrix 434 is completely filled with ones, then UXi (or UYj) is set to one; or (b) if the corresponding column i (or row j) in the M3 matrix 434 contains a one, and if the M3 matrix 434 contains a zero in the location having the same horizontal (or vertical) index in the same vertical (or horizontal) stripe, then UXi (or UYj) is set to one.

(12) The new state block 440 generates the new M1 values 422 according to formula (2) above, except that i'=K*L+[i/K], j'=K*L+[j/L], where [m/n] means the integer portion of the ratio m/n, and T1=T1(i) and T2=T2(j) are defined as shown in Table 23 below.

TABLE 23

| i | T1(i), i = 0, ..., KL − 1 | j | T2(j), i = 0, ..., KL − 1 |
|---|---|---|---|
| 0 | ~UX0 | 0 | ~UY0 |
| 1 | UX0 ∧ ~UX1 | 1 | UY0 ∧ ~UY1 |
| 2 | ~UX0 ∧ UX1 ∧ ~UX2 | 2 | ~UY0 ∧ UY1 ∧ ~UY2 |
| ... | | ... | |
| K − 1 | UX0 ∧ ... ∧ ~UX(K − 2) ∧ ~UX(K − 1) | L − 1 | UY0 ∧ ... ∧ ~UY(L − 2) ∧ ~UY(L − 1) |
| K | ~UXK | L | ~UYL |
| K + 1 | UXK ∧ ~UX(K + 1) | L + 1 | UYL ∧ ~UY(L + 1) |
| K + 2 | UXK ∧ UX(K + 1) ∧ ~UX(K + 2) | L + 2 | UYL ∧ UY(L + 1) ∧ ~UY(L + 2) |
| ... | | ... | |
| 2K − 1 | UXK ∧ ... ∧ UX(2K − 2) ∧ ~UX(2K − 1) | 2L − 1 | UYL ∧ ... ∧ UY(2L − 2) ∧ ~UY(2L − 1) |
| 2K | ~UX(2K) | 2L | ~UY(2L) |
| 2K + 1 | UX(2K) ∧ ~UX(2K + 1) | 2L + 1 | UY(2L) ∧ ~UY(2L + 1) |
| 2K + 2 | UX(2K) ∧ UX(2K + 1) ∧ ~UX(2K + 2) | 2L + 2 | UY(2L) ∧ UY(2L + 1) ∧ ~UY(2L + 2) |
| ... | | ... | |
| 3K − 1 | UX(2K) ∧...∧ UX(3K − 2) ∧ ~UX(3K − 1) | 3L − 1 | UY(2L) ∧...∧ UY(3L − 2) ∧ ~UY(3L − 1) |
| 3K | ~UX(3K) | 3L | ~UY(3L) |
| ... | | ... | |
| (L − 1)K − 1 | UX((L − 2)K) ∧...∧ UX((L − 1)K − 2) ∧ ~UX((L − 1)K − 1) | (K − 1)L − 1 | UY((K − 2)L) ∧...∧ UY((K − 1)L − 2) ∧ ~UY((K − 1)L − 1) |
| (L − 1)K | ~UX((L − 1)K) | (K − 1)L | ~UY((K − 1)L) |
| ... | | ... | |
| LK − 1 | UX((L − 1)K) ∧...∧ UX(LK − 2) ∧ ~UX(LK − 1) | KL − 1 | UY((K − 1)L) ∧...∧ UY(KL − 2) ∧ ~UY(KL − 1) |

(13) The repair scheme block 502 uses separate sets of possible values SI for each i and SJ for each j defined by formula (19) as follows:

$$SI1 = \{0, 1, \ldots, K-1\}$$

$$SI2 = \{K, K+1, \ldots, 2K-1\}$$

$$SI3 = \{2K, 2K+1, \ldots, 3K-1\}$$

$$\vdots$$

$$SIL = \{(L-1)K, (L-1)K+1, \ldots, LK-1\}$$

$$SJ1 = \{0, 1, \ldots, 2L-1\}$$

$$SJ2 = \{L, L+1, \ldots, 2L-1\}$$

$$SJ3 = \{2L, 2L+1, \ldots, 3L-1\}$$

$$\vdots$$

$$SJK = \{(K-1)L, K-1)L+1, \ldots, KL-1\}$$

(19)

Each set SI1, ..., SIL, SJ1, ..., SJK defines the possible values for each corresponding index in the matrices T(i1, ..., iL, j1, ... jK).

If no matrix T that covers the M1 matrix is found, then ERR is set to one. Otherwise, ERR is set to zero and one of the matrices T(i1, ..., iL, j1, ... jK) is selected. The X-selectors XS[1], ..., XS[L] and Y-selectors YS[1], ..., YS[K] represent the positions of i1, ..., iL, j1, ... jK inside the corresponding sets SI1, ..., SIL, SJ1, ..., SJK.

(14) The output value block 508 processes (K+L) GET commands, that is, GET[i] (i=1, ..., L) and GET[j] (j=1, ..., K), each returning the value X(SI(I)) or Y(SJ(j)), respectively.

In a further aspect of the present invention, a method of creating a netlist for repairing faults in a memory partitioned into K horizontal segments and L vertical segments and one correction line includes steps for:

(a) dividing each x and y address component into an upper portion and a lower portion;

(b) providing K*L registers to store the coordinates representative of a repair solution including L groups of X registers having K registers in each group and K groups of Y registers having L registers in each group;

(c) dimensioning an M1 matrix with K*L rows and K*L columns;

(d) creating (K*L+L) I flags and (K*L+K) J flags;

(e) dimensioning M2 and M3 matrices with (K*L+L) rows and (K*L+K) columns to include one extra column for each of L vertical strips and one extra row for each of K horizontal strips;

(f) creating variables UXi, UYj, WEXi, WEYj wherein i=1, ..., L and j=1, ..., K;

(g) creating X-selectors XS[1], ..., XS[L] each having one of K possible values and Y-selectors YS[1], ..., YS[K] each having one of L possible values;

(h) dimensioning the width of the command signals bus to include GET commands for each of the X and Y registers; and (i) defining separate sets of possible values SI for each i=1, ..., K and SJ for each j=1, ..., L for each corresponding index in matrices T(i1, ..., iL, j1, ... jK).

FIG. 7 illustrates a flow chart 700 for a method of creating a netlist for a memory partitioned into K row segments and L column segments and one correction line according to an embodiment of the present invention.

Step 702 is the entry point of the flow chart 700.

In step 704, each x and y address component is divided into an upper portion and a lower portion.

In step 706, 2K*L registers X(SI(I)) and Y(SJ(J)) are provided to store the coordinates representative of the repair solution, including L groups of X registers having K registers in each group and K groups of Y registers having L registers in each group.

In step 708, the M1 matrix is dimensioned with K*L rows and K*L columns.

In step 710, (K*L+L) I flags and (K*L+K) J flags are created.

In step 712, the M2 and M3 matrices are dimensioned with (K*L+L) rows and (K*L+K) columns, that is, one extra column for each of L vertical strips and one extra row for each of K horizontal strips.

In step 714, variables UXi, UYj, WEXi, WEYj are created, where i=0, ..., L–1 and j=0, ..., K–1.

In step 716, L X-selectors XS[1], ..., XS[L] each having one of K possible values and K Y-selectors YS[1], ..., YS[K] each having one of L possible values are provided.

In step 718, the width of the command signals bus is dimensioned to include GET commands for each of the X and Y registers.

In step 720, separate sets of possible values SI for each i=1, ..., K and SJ for each j=1, ..., L are defined for each corresponding index in the matrices T(i1, ..., iL, j1, ... jK).

Step 722 is the exit point of the flow chart 700.

FIG. 8 illustrates a flow chart 800 for a method of calculating a repair solution for the netlist of FIG. 7.

Step 802 is the entry point of the flow chart 800.

In step 804, the local index block 424 calculates the I[i] flags and the J[j] flags as follows. If the current x-coordinate equals one of the X registers, the I[i] flag corresponding to the X register is set to one. If the current x-coordinate does not equal one of the X registers, then the corresponding I[i] flag is set to mark the corresponding vertical segment. In the same manner, the J[j] flags are set for the y-coordinates.

In step 806, values of use vector 438 UXi, (i=0, ..., L–1), UYj (j=0, ..., K–1) are calculated as follows:

(a) if the corresponding column i (or row j) in the M3 matrix is completely filled with ones, then UXi (or UYj) is set to one; or (b) if the corresponding column i (or row j) in the M3 matrix contains a one, and if the M3 matrix contains a zero in the location having the same horizontal (or vertical) index in the same vertical (or horizontal) stripe, then UXi (or UYj) is set to one.

In step 808, the new M1 values are generated from the use vector.

In step 810, if no first matrix T that covers the M1 matrix is found, then control is transferred to step 732, otherwise control is transferred to step 734.

In step 812, ERR is set to one and control is transferred to step 818.

In step 814, ERR is set to zero and the X-selectors XS[1], ..., XS[L] and Y-selectors YS[1], ..., YS[K] are representative of the positions of i1, ..., iL, j1, ... jK inside the corresponding sets SI1, ..., SIL, SJ1, ..., SJK.

In step 816, the values of X(SI(I)) and Y(SJ(J)) are generated as output.

Step 818 is the exit point of the flow chart 800.

Although the method of the present invention illustrated by the flowchart description above is described and shown with reference to specific steps performed in a specific order, these steps may be combined, sub-divided, or reordered without departing from the scope of the claims. Unless specifically indicated herein, the order and grouping of steps is not a limitation of the present invention.

While the invention herein disclosed has been described by means of specific embodiments and applications thereof, numerous modifications and variations may be made thereto by those skilled in the art without departing from the scope of the invention set forth in the following claims.

What is claimed is:

1. A controller for repairing a redundant memory circuit comprising:

a fault storage matrix for storing a repair solution;

a register block for storing row and column coordinates of the repair solution; and a repair solution calculator coupled to the plurality of registers and the fault storage matrix for receiving an x-coordinate and a y-coordinate of a defective memory cell of the redundant memory circuit, mapping the repair solution in the fault storage matrix, and for determining whether a repair solution may be found for the defective memory cell from the fault storage matrix.

2. The controller of claim 1 wherein the repair solution calculator calculates the repair solution and stores the repair solution in the plurality of registers.

3. The controller of claim 2 wherein the repair solution calculator determines whether a repair solution may be found for each x-coordinate and y-coordinate of a defective memory cell received.

4. The controller of claim 1 further comprising a Built-In Self-Test for finding the x-coordinate and the y-coordinate of each defective memory cell and for receiving the repair solution.

5. The controller of claim 1 wherein the repair solution calculator comprises a local index block, an M2 matrix block, an M3 matrix block, a use matrix block, a new state block, a repair scheme block, and an output value block.

6. The controller of claim 5 wherein the local index block receives as input the x-coordinate, the y-coordinate, and the row and column coordinates of the repair solution and generates as output local index flag arrays I and J such that only one local index flag I has a value of one and only one local index flag J has a value of one for each value of the x-coordinate and the y-coordinate.

7. The controller of claim 6 wherein the M2 matrix block receives as input the local index flags and computes an M2 matrix from the fault storage matrix.

8. The controller of claim 7 wherein the M3 matrix block receives as input the M2 matrix and computes an M3 matrix wherein a set matrices $T=T(i1, i2, j1, j2)$ is defined such that the indices i1 and j1 are each elements of a set $\{0, 1, 4\}$ and the indices i2 and j2 are each elements of a set $\{2, 3, 5\}$ and wherein the value of $T(i1, i2, i1, j2)[i,j]=1$ if at least one of these four conditions is true: i=i1, or i=i2, or j=j1, or j=j2 and wherein if one of the matrices $T=T(i1, i2, j1, j2)$ covers M2, then $M3[i,j]=0$ if $T[i,j]=0$.

9. The controller of claim 8 wherein the use matrix block receives as input the M3 matrix and computes a use vector (UX0, UX1, UX2, UX3, UY0, UY1, UY2, UY3) wherein the use vector represents current values of the repair solution that may not be altered and wherein the value of each of UX0, UX1, UX2, UX3, UY0, UY1, UY2, UY3 is one if a corresponding row or column in the M3 matrix contains all ones, or if the corresponding row or column in the M3 matrix contains a one and a neighboring row or column contains a zero in the corresponding position.

10. The controller of claim 9 wherein the new state block receives as input the use vector and the M3 matrix and generates new fault storage matrix values.

11. The controller of claim 10 wherein the repair scheme block receives as input the M1 fault storage matrix and the selector signals and generates as output an error signal and selector signals wherein a set of matrices $W=W(i1, i2, j1, j2)$ is defined wherein i1 and j1 are elements of a set $\{0,1\}$ and i2 and j2 are elements of a set $\{2,3\}$ and wherein $W(i1, i2, j1, j2)[i,j]=1$ if at least one of these four conditions is true: i=i1, or i=i2, or j=j1, or j=j2 and wherein if one of the matrices $W=W(i1, i2, j1, j2)$ covers the fault storage matrix, then an error flag indicates that no repair solution may be found, else the error flag indicates that the repair solution was found.

12. The controller of claim 11 wherein the output value block receives as input the selector signals and generates as output the repair solution.

13. A method of repairing faults in a redundant memory comprising steps for:

(a) initializing a fault storage matrix;

(b) receiving an x-coordinate and a y-coordinate of a defective memory cell;

(c) attempting a calculation of a repair solution from the fault storage matrix and the x-coordinate and a y-coordinate of a defective memory cell to determine whether a repair solution may be found;

(d) if the repair solution may be found, then transferring control to step (e), else transferring control to step (j);

(e) mapping the repair solution in the fault storage matrix;

(f) storing row and column coordinates representative of the repair solution in a plurality of registers;

(g) if another defective memory cell is to be added to the repair solution, then transferring control to step (b), else transferring control to step (h);

(h) setting an error flag to indicate that the repair solution is ready;

(i) generating the repair solution from the plurality of registers as output and transferring control to step (k);

(j) setting the error flag to indicate that no further fault detection processing need be performed and that the memory cannot be repaired; and (k) terminating.

14. A method of creating a netlist for repairing faults in a memory partitioned into K horizontal segments and L vertical segments and one correction line comprising steps for:

(a) dividing each x and y address component into an upper portion and a lower portion;

(b) providing registers X(SI(I)) and Y(SJ(J)) to store the coordinates representative of a repair solution;

(c) dimensioning an M1 matrix with K*L rows and K*L columns;

(d) creating I flags and J flags;

(e) dimensioning M2 and M3 matrices with (K*L+L) rows and (K*L+K) columns to include one extra column for each of L vertical strips and one extra row for each of K horizontal strips;

(f) creating variables UXi, UYj, WEXi, WEYj wherein i=1, ..., L and j=1, ..., K;

(g) creating X-selectors XS[1], ..., XS[L] each having one of K possible values and Y-selectors YS[1], ..., YS[K] each having one of L possible values;

(h) dimensioning the width of the command signals bus to include GET commands for each of the X and Y registers; and (i) defining separate sets of possible values SI for each i=1, . . . , K and SJ for each j=1, . . . , L for each corresponding index in matrices T(i1, . . . , iL, j1, . . . jK).

15. The method of claim 14 further comprising steps for:

(j) calculating values for the I flags and the J flags as a function of a current x-coordinate, a current y-coordinate, the X registers, and the Y registers;

(k) calculating values of the variables UXi and UYj as a function of the M3 matrix;

(l) calculating new values of the M1 matrix from the variables UXi and UYj;

(m) if no matrix T covers the M1 matrix, then transferring control to step (n), otherwise transferring control to step (o);

(n) setting a value of a variable ERR to one to indicate that no repair solution may be found and transferring control to step (q);

(o) setting a value of the variable ERR to zero to indicate that the X-selectors XS[1], . . . , XS[L] and Y-selectors YS[1], . . . , YS[K] are representative of positions of i1, . . . , iL, j1, . . . jK inside corresponding sets SI1, . . . , SIL, SJ1, . . . , SJK;

(p) generating as output values of the registers X(SI(I)) and Y(SJ(J)); and (q) terminating.

* * * * *